United States Patent
Kim et al.

(10) Patent No.: US 9,621,148 B2
(45) Date of Patent: Apr. 11, 2017

(54) HIGH SPEED SWITCHING

(71) Applicant: NXP B.V., Eindhoven (NL)

(72) Inventors: Jong Kim, Tempe, AZ (US); Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 163 days.

(21) Appl. No.: 14/263,814

(22) Filed: Apr. 28, 2014

(65) Prior Publication Data

US 2015/0180460 A1    Jun. 25, 2015

Related U.S. Application Data (60) Provisional application No. 61/918,900, filed on Dec. 20, 2013.

(51) Int. Cl.
   *H03K 17/687*   (2006.01)
   *H03K 17/0412*  (2006.01)

(52) U.S. Cl.
   CPC .............. *H03K 17/04123* (2013.01)

(58) Field of Classification Search
   CPC ........ H01L 2924/00; H01L 2924/0002; H02M 3/158; H02M 3/33592
   See application file for complete search history.

(56) References Cited

U.S. PATENT DOCUMENTS

2013/0219245 A1* 8/2013 Alexeyev ............... G06N 7/005
                                                    714/763

OTHER PUBLICATIONS

CBTW28DD14, 14-bit bus switch/multiplexer for DDR2/DDR3/DDR4 application, Product Data Sheet, Rev. 4, Aug. 12, 2013.
CBTLO6GP213, Second generation high performance general purpose switch, Product Data Sheet, Rev. 2. Feb. 17, 2014.

* cited by examiner

*Primary Examiner* — Sibin Chen (57) ABSTRACT

Switching circuits are implemented in a manner that facilitates fast switching, which can be effected while also maintaining relatively low power dissipation. As may be implemented in connection with one or more embodiments, an apparatus includes a transistor connected between an input port and an output port, and a gate that switches between on and off states. A charge storage circuit stores a charge, and a switching circuit operates by switching the transistor between the on and off states as follows. In a first charging mode, a voltage is coupled across the charge storage circuit and a charge is stored therein, while decoupling the transistor from the charge storage circuit. In a second discharge mode, the transistor is switched from the off state to the on state, while coupling the stored charge across the gate and one of the source and drain of the transistor.

20 Claims, 4 Drawing Sheets

HIGH SPEED SWITCHING

Aspects of various embodiments are directed to switching and to apparatuses and methods involving high-speed semiconductor switches.

Many switching applications benefit from high-speed application, such as for passing data in one or more directions through a switch. Often, such switches are implemented with transistor circuitry, such as in multiplexing applications. However, when switching or reconfiguration occurs, the gate-source voltage (or gate-drain voltage, depending upon the application) may take a certain amount of time to settle to a value that is amenable for the transfer of data.

In many switching applications, power dissipation is also desirably minimized. In this regard, many applications implement a relatively slow gate bias voltage response time to minimize power dissipation. This slow gate bias voltage response time may result in undesirably slow switching.

These and other matters have presented challenges to switching for a variety of applications, and particularly to high-speed switching applications in which power dissipation can also be challenging.

Various example embodiments are directed to switching apparatuses and their implementation, and to addressing challenges including those discussed in the Background section above.

According to an example embodiment, an apparatus includes a transistor having a source and drain connected in series between an input port and an output port, and a gate that switches the transistor between an on state, in which the transistor connects the input port to the output port, and an off state, in which the transistor disconnects the input port from the output port. A charge storage circuit stores a charge and a switching circuit switches the transistor between the on state and the off state as follows. In a first charging mode, the switching circuit couples a voltage across the charge storage circuit and stores a charge in the charge storage circuit, while decoupling the transistor from the charge storage circuit. In a second discharge mode, the switching circuit switches the transistor from the off state to the on state by coupling the stored charge across the gate and one of the source and drain of the transistor.

Another embodiment is directed to an apparatus including a first circuit that stores a charge, a transistor, and a second circuit that operates the transistor in first and second modes. The transistor has a source, drain, and gate that operate in an on state in which data is passed between an input port and an output port via the source and drain, and that operate in an off state in which data is not passed between the input port and the output port. The second circuit operates in the first mode by coupling a supply voltage to the first circuit and storing a charge in the first circuit. In the second mode, the second circuit couples the supply voltage to the gate, decouples the supply voltage from the first circuit, and after decoupling the supply voltage from the first circuit, couples the stored charge across the gate and one of the source and drain of the transistor.

Another embodiment is directed to a method in which a charge is stored in a charge storage circuit, and a transistor is operated using a switching circuit as follows. In a first charging mode, a voltage is coupled across the charge storage circuit and a charge is stored in the charge storage circuit while decoupling the transistor from the charge storage circuit. In a second discharge mode, the transistor is switched from the off state to the on state by coupling the stored charge across the gate and one of the source and drain of the transistor. The transistor has a source and drain connected in series between an input port and an output port, and a gate that switches the transistor between an on state, in which the transistor connects the input port to the output port (in accordance with the second discharge mode), and an off state, in which the transistor disconnects the input port from the output port.

The above discussion/summary is not intended to describe each embodiment or every implementation of the present disclosure. The figures and detailed description that follow also exemplify various embodiments.

Various example embodiments may be more completely understood in consideration of the following detailed description, in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure, including aspects defined in the claims. In addition, the term "example" as used throughout this application is only by way of illustration, and not limitation.

Aspects of the present disclosure are believed to be applicable to a variety of different types of apparatuses, systems and methods involving high-speed switching. While not necessarily so limited, various aspects may be appreciated through a discussion of examples using this context.

Various example embodiments are directed to addressing challenges, including those that are discussed in the Background section. For instance, various aspects are directed to pre-charging a gate-source, or gate-drain voltage of a switching transistor to facilitate rapid settling of the gate-source or gate-drain voltage for data flow. Such aspects may, for example, address challenges that occur when ramping up a transistor gate/source voltage upon switching the transistor from an off state to an on state. Many such embodiments also facilitate driving the transistor gate by a low power/current biasing circuit to save power, while also achieving fast switching via the storage and implementation of a pre-charge across the transistor gate and source/drain.

Using these approaches, the turn-on time or reconfiguration time is enhanced by implementing a pre-charge at the beginning of a switching mode, while normal biasing across the transistor gate and source/drain catches up. For instance, a high speed switch and/or multiplexer can achieve nanosecond switching time or reconfiguration time, with relatively low or minimum average power consumption. Such low power consumption may, for example, be implemented using a switch having a gate bias voltage response time that is set to a micro-second switching/reconfiguration time and therein achieves low power consumption, yet using a precharge circuit, as discussed herein, to prepare the switch for data transfer in a much shorter (e.g., nanosecond) timeframe.

In a more particular embodiment, nanosecond switching/reconfiguration time is achieved by charging a gate-source voltage of a switch using a capacitor that is pre-charged to the power supply level at which the gate is to be biased (e.g., within a few nanoseconds). Once charged, the gate-voltage of the switch device can maintain a voltage difference close to the power supply, which allows the data transmission to start. In some implementations, a switching/reconfiguration time of about 10 ns is achieved using this approach.

According to an example embodiment, a data communication apparatus uses a pre-charge to settle a transistor's gate-source or gate-drain voltage, in order to mitigate delay in the transfer of data as follows. A transistor has a source and drain connected in series between an input port and an output port, and a gate that switches the transistor between an on state, in which the transistor connects the input port to the output port, and an off state, in which the transistor disconnects the input port from the output port. A charge storage circuit stores a charge (e.g., as provided by a voltage/power supply), and a switching circuit switches the transistor between the on state and the off state as follows. In a first charging mode, the switching circuit couples a voltage across the charge storage circuit and stores a charge in the charge storage circuit, while decoupling the transistor from the charge storage circuit (e.g., maintaining switches between the charge storage circuit and the transistor in an open state). In a second discharge mode, the switching circuit switches the transistor from the off state to the on state by coupling the stored charge across the gate and one of the source and drain of the transistor (e.g., to set or maintain the gate-source or gate-drain voltage about constant).

In some implementations, the charge storage circuit includes a capacitor having first and second capacitor plates, and the switching circuit includes first and second sets of switches, as well as a control circuit, as follows. The first set of switches connects the first capacitor plate to an input voltage supply port, and connects the second capacitor plate to a ground-level port. The second set of switches connects the first capacitor plate to the gate, and connects the second capacitor plate to the one of the source and the drain of the transistor across which the stored charged is coupled. The control circuit operates in the first charging mode to couple the first capacitor plate to the input voltage supply port, and to couple the second capacitor plate to the ground-level port, by operating the first set of switches in a closed state and operating the second set of switches in an open state. In the second discharge mode, the control circuit couples the first capacitor plate to the gate and the second capacitor plate to the source, by operating the first set of switches in an open state and operating the second set of switches in a closed state. Accordingly, delays in a start of data flow through the source and drain of the transistor are mitigated upon switching of the transistor from the off state to the on state. Such an approach can be implemented to ensure non-overlapping operation of the first and second sets of switches, in which the first set of switches are opened before the second set of switches are closed.

Figure 2:
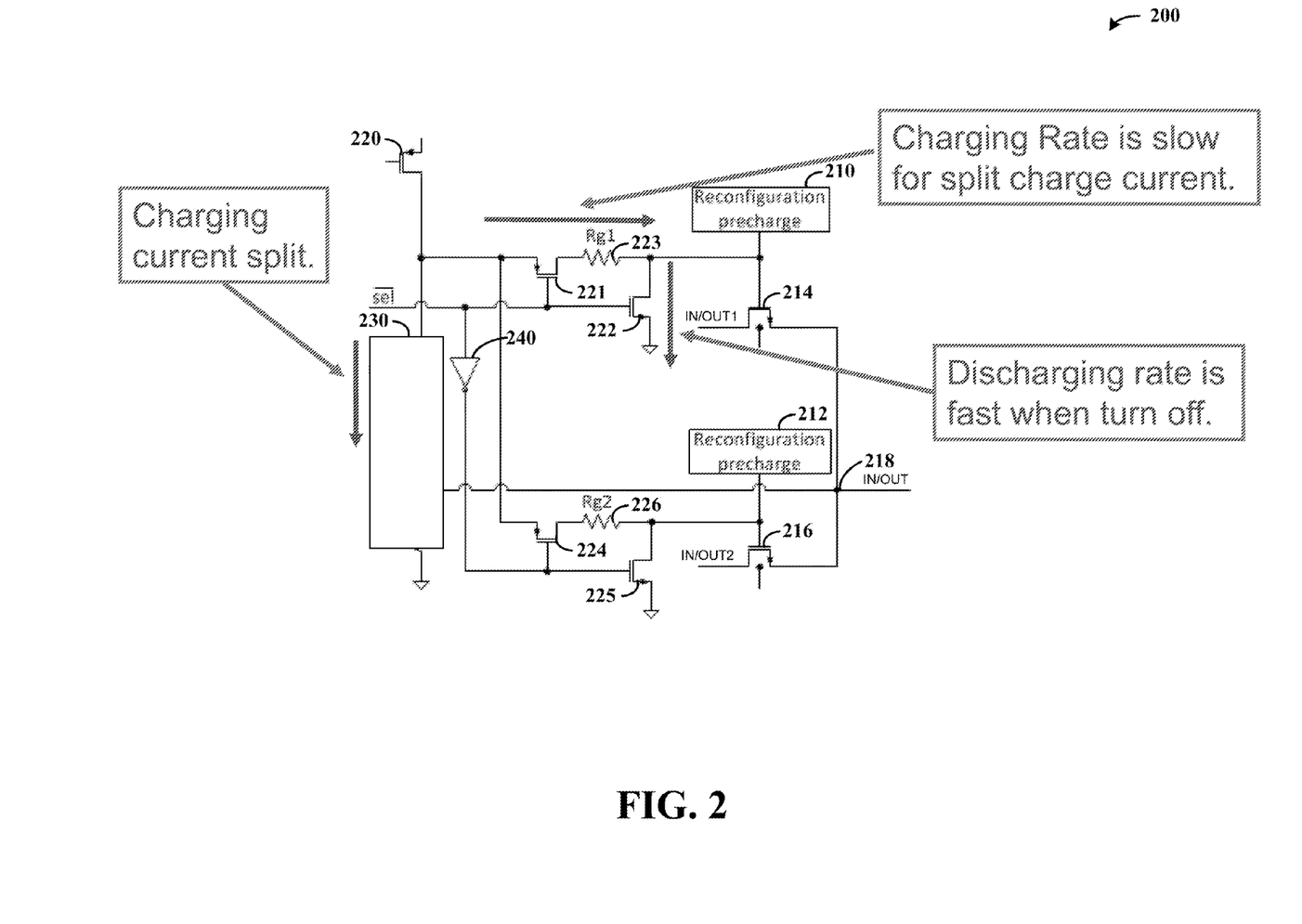
FIG. 2 shows a switch, in accordance with another example embodiment.
Figure 4:
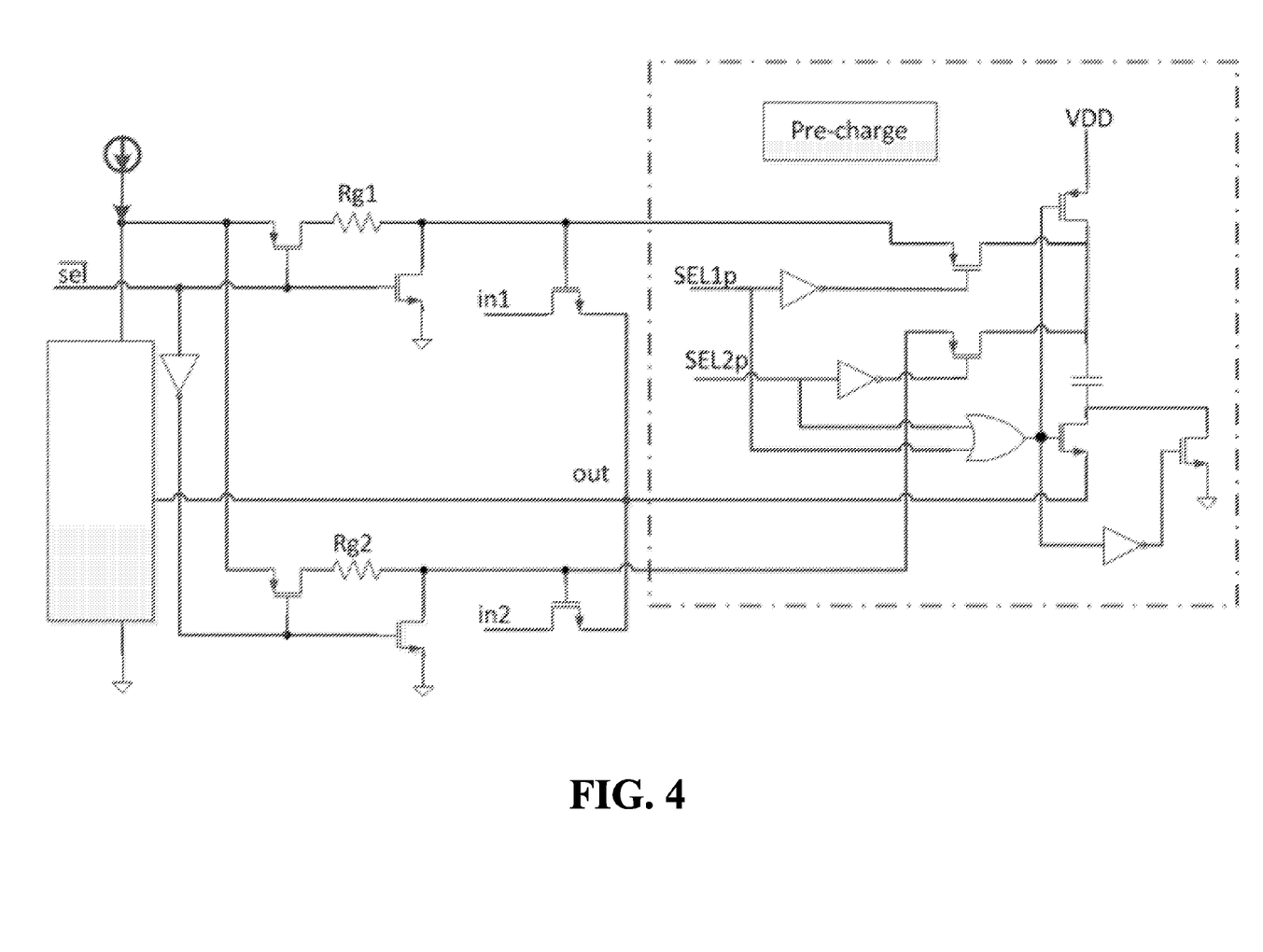
FIG. 4 shows another circuit, in accordance with another example embodiment.

The switching can be effected in a variety of manners to suit particular embodiments, such as those shown in FIGS. 2 and 4. In some embodiments, the switches include a cross-coupled NAND gate and inverters that are triggered by a one-shot signal to initiate operation of the respective charging and discharge modes. The respective gates and inverters are appropriately coupled to open/close switches, to effect the charging of the charge storage circuit and coupling/discharge of the charge storage circuit across the transistor. In some implementations, a delay circuit is integrated therewith to effect a delay between the opening and closing of respective switches to ensure the proper application of the pre-charge.

The switching circuit is operated in a variety of manners to suit particular embodiments. In some implementations, the switching circuit operates in the first charging mode by disconnecting the transistor from the charge storage circuit, and thereafter connecting the charge storage circuit between a voltage supply port and a ground-level port. The switching circuit operates in the second discharge mode by disconnecting the charge storage circuit from the voltage supply port and the ground-level port, and thereafter connecting the charge storage circuit across the gate and source.

In another implementation, the switching circuit operates with the transistor to, in the second discharge mode, use the stored charge to bias the gate to the stored charge level while coupling a bias voltage supply node to the gate. This is carried out by biasing the gate with the stored charge while the bias voltage applied to the gate ramps from a low voltage level to the bias voltage level. Any time delay in data transfer that would exist for ramping the bias voltage at the gate to the bias voltage level is mitigated via the application of the stored charge.

In yet another implementation, the switching circuit operates with a delay mode as follows. The transistor is decoupled from a supply voltage that is used to couple the voltage across the charge storage circuit, for switching between the first charging mode and the second discharge mode. Thereafter, a delay time period is effected in which the transistor is decoupled from both the supply voltage and the gate. After the delay, the second discharge mode is initiated by coupling the charge storage circuit across the gate and the one of the source and drain of the transistor, while maintaining the decoupling of the transistor from the supply voltage.

Another embodiment is directed to a switching apparatus in which a stored charge is used to raise a gate-source or gate-drain voltage of the transistor (switch) while the supply voltage applied to the gate ramps up, therein mitigating delays in achieving a gate-source or gate-drain voltage equilibrium using the application of the supply voltage directly to the gate. The apparatus includes a first circuit that stores a charge, and a second circuit that operates the transistor in first and second modes. The transistor has a source, drain and gate that operate in an on state in which data is passed between an input port and an output port via the source and drain, and that operate in an off state in which data is not passed between the input port and the output port. The second circuit operates in the first mode by coupling a supply voltage to the first circuit and storing a charge in the first circuit. In the second mode, the second circuit couples the supply voltage to the gate, decouples the supply voltage from the first circuit, and after decoupling the supply voltage from the first circuit, couples the stored charge across the gate and one of the source and drain of the transistor.

In some embodiments, the first circuit includes a capacitor having first and second capacitor plates, and the second circuit includes respective sets of switches and a control circuit that operates the switches as follows, to mitigate delays in a start of data flow through the transistor upon switching the transistor to the on state. In a first mode, the first capacitor plate is coupled to the supply voltage and the second capacitor plate is coupled to a ground-level port, by operating a first set of switches in a closed state and operating a second set of switches in an open state. In the second mode, the first capacitor plate is coupled to the gate and the second capacitor plate is coupled to the source by operating the first set of switches in an open state and operating the second set of switches in a closed state. In certain embodiments, a delay circuit delays closing the second set of switches, upon transition from the first mode to the second mode, to ensure that the first set of switches are switched to the open state before the second set of switches are switched to the closed state.

Another embodiment is directed to a method for mitigating delays in a start of data flow through a transistor, as follows. A charge is stored in a charge storage circuit (e.g., in a capacitor), and a transistor is operated to mitigate slow ramp-up of a gate-source or gate-drain voltage level of a transistor and related delay in data transmission. In a first charging mode, a voltage is coupled across the charge storage circuit and a charge is stored in the charge storage circuit while decoupling the transistor from the charge storage circuit. For instance, the charge may be stored by coupling a first capacitor plate to a voltage supply, and a second capacitor plate to ground. In a second discharge mode, the transistor is switched from the off state to the on state by coupling the stored charge across the gate and one of the source and drain of the transistor. The transistor has a source and drain connected in series between an input port and an output port, and a gate that switches the transistor between an on state in which the transistor connects the input port to the output port (in accordance with the second discharge mode), and an off state in which the transistor disconnects the input port from the output port. This second discharge mode may, for example, be effected by coupling the first capacitor plate to the gate and coupling the second capacitor plate to the source, via operation of the first set of switches in an open state and the second set of switches in a closed state.

Such approaches may, for example, be implemented to mitigate delay in equilibrating the gate-source voltage or the gate-drain voltage of the transistor, as would occur upon coupling the gate to the supply voltage without coupling the stored charge across the gate and the one of the source and drain of the transistor. For instance, delay in a start of data flow through the source and drain of the transistor upon switching of the transistor from the off state to the on state can be reduced by using the stored charge to set the gate-source or gate-drain voltage. If this is done while coupling a bias voltage supply node to the gate, the stored charge provides the appropriate gate-source or gate-drain voltage while the bias voltage ramps up.

Figure 1:
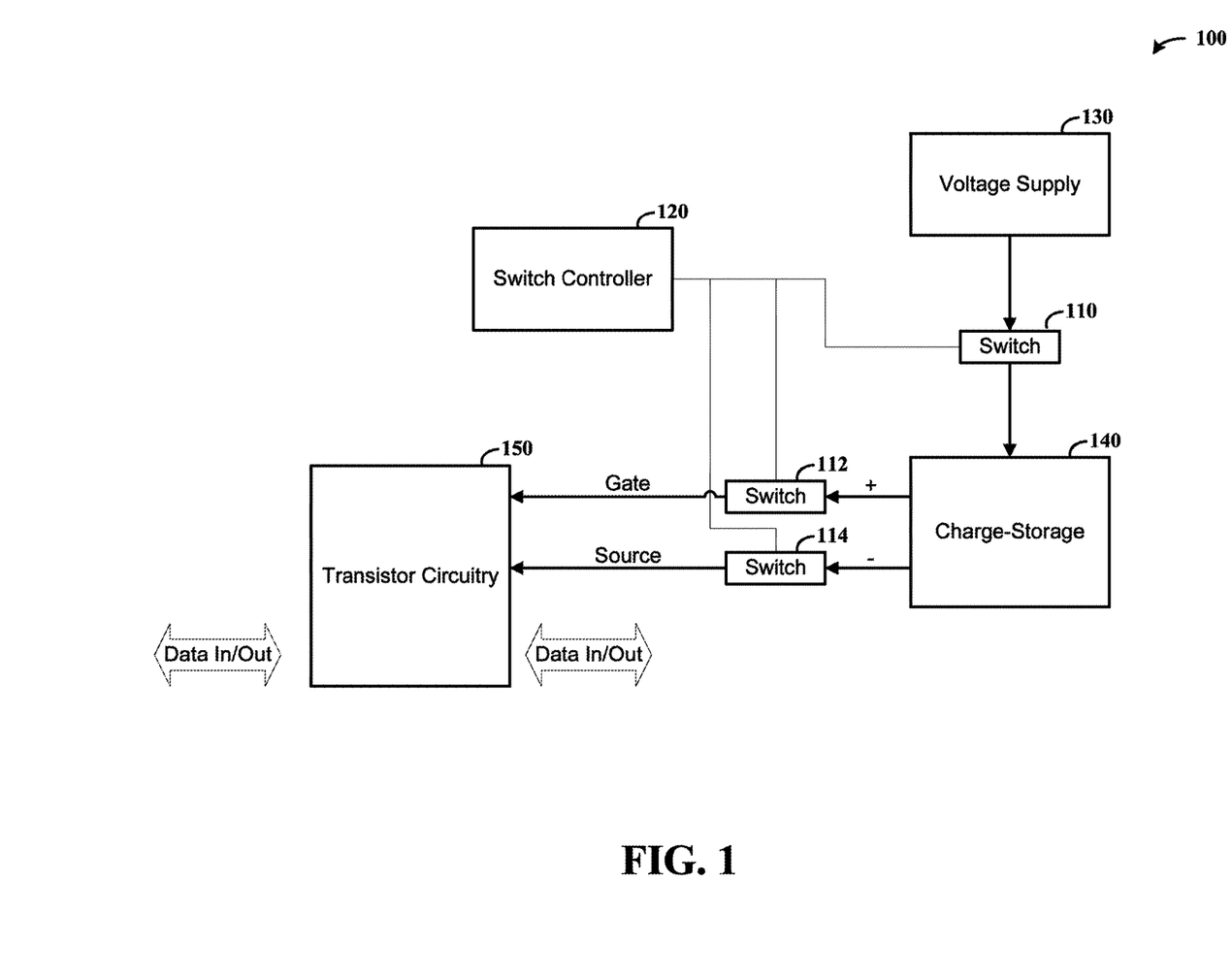
FIG. 1 shows a data communication circuit, in accordance with an example embodiment.

Turning now to the figures, FIG. 1 shows a data communication circuit 100, in accordance with another example embodiment. The data communication circuit 100 includes switching circuitry, including switches 110, 112 and 114, and a switch controller 120 that controls the switching circuitry. The switch controller 120 controls the switching circuitry to use voltage provided by a voltage supply 130 to store charge in a charge-storage circuit 140, for use in operating transistor circuitry 150.

In some embodiments, the data communication circuit 100 operates in a charging mode in which the switch controller 120 controls switch 110 in a closed condition to couple the voltage supply 130 to the charge-storage circuit 140, while also controlling switches 112 and 114 in an open condition. When data is to be passed via the transistor circuitry 150 (e.g., in one or both directions), the switch controller 120 operates switches 112 and 114 to couple the charge stored on the charge-storage circuit 140 across the transistor circuitry 150, such as by coupling a gate-source or gate-drain voltage to a transistor or transistors.

FIG. 2 shows a switch circuit 200, in accordance with another example embodiment. The switch circuit 200 includes reconfiguration/precharge circuits 210 and 212, which are implemented to facilitate switching of input signals in1 and in2, via transistors 214 and 216, to an input/output port 218. The switch circuit 200 also includes an input transistor 220, which is coupled respectively to the transistor 214 via transistor 221 and resistor 223, and to transistor 216 via transistor 224 and resistor 226. A select signal is coupled to the gates of transistor 222 and transistor 225 (through inverter 240), with input transistor 220 providing a current input to the rest of the circuit. Circuit 230 is used to calculate/maintain the gate-source/drain voltage for transistor 214 or transistor 216. In some implementations, power consumption is minimized by limiting current input from input transistor 220.

Figure 3A:
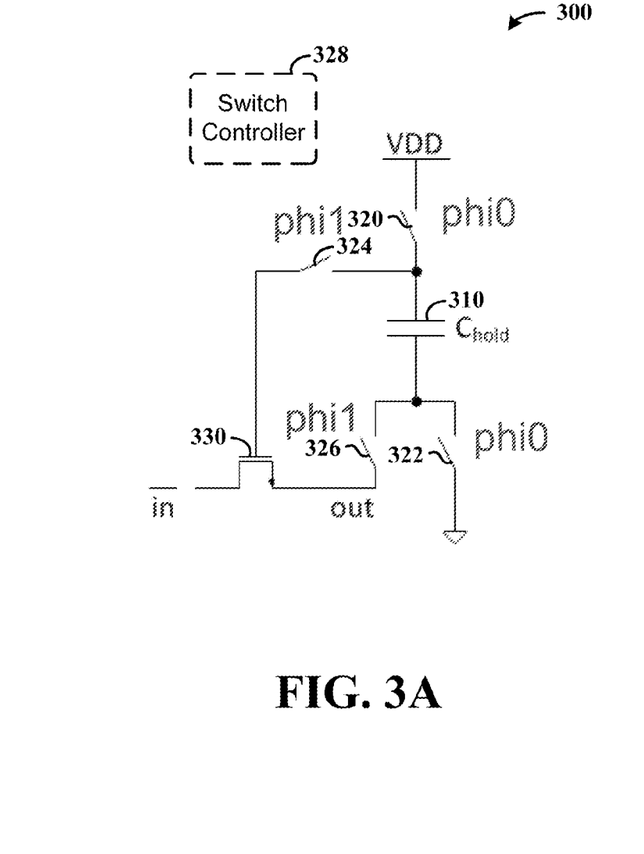
FIG. 3A shows a pre-charge circuit, in accordance with another example embodiment.

FIG. 3A shows a pre-charge circuit 300 in accordance with another example embodiment. The pre-charge circuit 300 includes a capacitor 310, selectively coupled to a supply voltage (VDD) input by switches 320 and 322, and further selectively coupled by switches 324 and 326 to a transistor 330. The pre-charge circuit operates to charge the capacitor 310, and use the capacitor charge to rapidly apply a gate-source voltage to the transistor 330 for passing data. The switches may, for example, be operated via a switch controller 328 (e.g., as may be connected to control each switch to provide phi0 and phi1 control outputs).

Figure 3B:
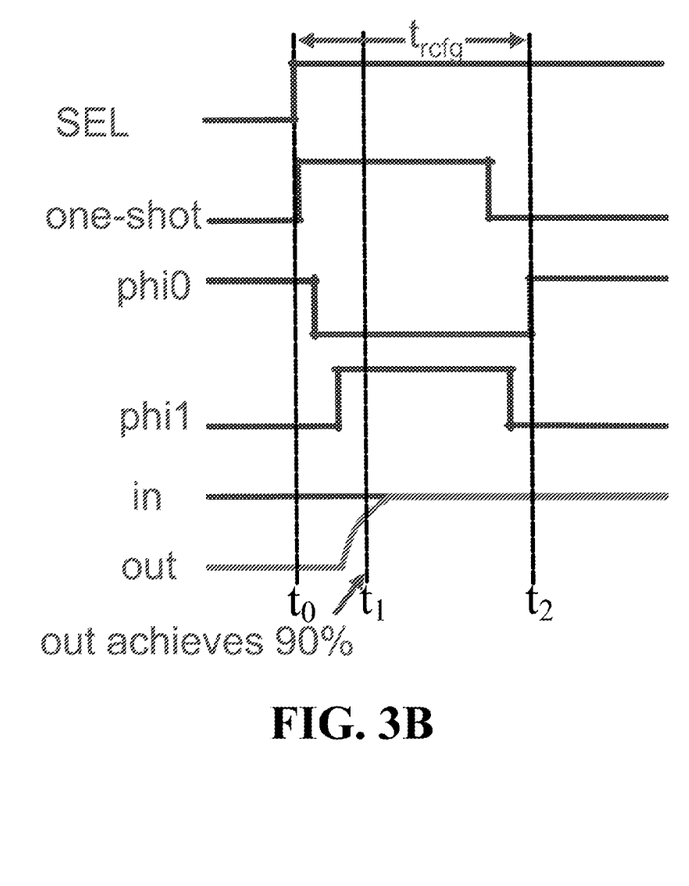
FIG. 3B shows a timing diagram, as may be implemented with the circuit in FIG. 3A, in accordance with one or more example embodiments.

FIG. 3B shows a timing diagram as may be implemented with the pre-charge circuit 300, in accordance to one or more embodiments. When the pre-charge circuit 300 is to be operated for passing data, a select input goes high, which triggers a one-shot. With phi0 starting high, each of switches 320 and 322 are closed and the capacitor 310 is charged. After the one-shot is triggered or transitioned to logic high, phi0 goes low to open switches 320 and 322, decoupling the capacitor 310 from VDD. Thereafter, phi1 goes high to close switches 324 and 326 and couple the charge on capacitor 310 across the gate-source of the transistor 330. As shown in the lower portion of the plot, the output signal achieves the input signal level rapidly (90% by time $t_1$), during a total reconfiguration cycle time $t_{refg}$. After the cycle is over, switches 324 and 326 are opened (phi1 goes low), and thereafter switches 320 and 322 are closed again (phi0 goes high) to recharge the capacitor 310.

In some embodiments, the one shot signal is generated by an XOR SEL0/1 with a delay (e.g., by an inverter chain), where the delay determines the pulse width of the one shot. As shown, phi0 and phi1 are non-overlapping, with the timing being tailored to suit particular applications. These signals may, for example, be generated from a cross-coupled NAND gate and inverters that are triggered by the one-shot signal.

In some implementations, phi1 is implemented with three versions: phi1a/b/c. Version phi1a is a delayed version (falling edge is delayed) of either phi1b or phi1c, with phi1 being used for two channels (channel b and channel c). Each of phi1b and phi1c are used separately for different channels, with only one being used at a time. Version phi1a is used to control switch 326, which connects the capacitor 310 to VDD. Each of phi1b/c is used to control the switch 324, connecting the capacitor 310 to the transistor 330. Version phi1a is delayed to be sure the capacitor 310 is cut off from the main switch gate before it is cut off from the main switch source/drain, in order to avoid any leakage or charge sharing.

FIG. 4 shows another circuit 400, in accordance with another example embodiment. The circuit 400 includes a pre-charge portion 405, which facilitates pre-charging of a gate-source (or gate-drain) voltage for providing inputs in1 and in2 to an output node. The pre-charge portion 405 is operated via select signals SEL1p and SEL2p, respectively coupled to transistors 414 and 416 via inverters 410 and 412, to facilitate charging of capacitor 420. Transistors 418 and 424 are coupled via the capacitor 420, and controlled by an input provided via OR gate 422, which has its inputs respectively coupled to SEL1p and SEL2p. Transistor 426 is coupled between a reference (e.g., ground) node and the capacitor 420, and is operated through the OR gate 422 and an inverter 428.

In steady state, circuit 430 develops Vgs by the charging current I, provided at current source 432. A select (sel) signal is coupled directly to operate transistors 450 and 454 (with resistor 452 therebetween), as well as transistor 456, for providing input signal in1 to an output node. The select signal is also coupled through an inverter 440 to operate transistors 460 and 464 (with resistor 462 therebetween), to operate transistor 466 for providing input signal in2 to the output node. The circuit 400 also includes transistors 450 and 460 that couple charging current via resistors 452 and 462, and select transistors 454 and 464 (through inverter 440), with circuit 430 operable to maintain gate to source/drain voltage.

Accordingly, the pre-charge portion 405 is operable to provide a charge stored on the capacitor 420 across the gate-source of transistor 456 or the gate-source of transistor 466, for providing in1 or in2 respectively to the output node during an initial switching state. Such communication can be bidirectional as well, with in1 and in2 acting as outputs, and the output acting as an input. These approaches facilitate rapid switching of the respective transistors, which can then be maintained in an on (closed) state via coupling through transistor 450 (for in1) and through transistor 460 (for in2). Such an approach may, for example be implemented using a timing diagram similar to that as shown in FIG. 3B.

The embodiments described herein may be implemented in a variety of applications, and modified to suit the particular application in which they are implemented. For instance, some embodiments are directed to circuitry used in high speed standards such as DDR4, PCIe, USB, SATA, HDMI, DisplayPort, Ethernet, MIPI, and V-by-One. For instance, one or more aspects may be implemented with transmitters, inputs, line drivers, and receivers as may be implemented with one or more of these standards. Various aspects are also directed to applications in which a reduction of die area and wire bond length is desirable, and to applications in which an improvement in manufacturing yield is desirable.

The various embodiments described herein may be combined in certain embodiments, and various aspects of individual embodiments may be implemented as separate embodiments. For instance, aspects of FIG. 4 may be implemented with the charge-storage circuitry 140 and switching circuitry of FIG. 1.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., the switch controller 120, charge storage circuit 140, and reconfiguration/pre-charge circuits 210/212). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, various types of switching circuits can be used for controlling pre-charge and discharge states of respective circuits. Such modifications do not depart from the true spirit and scope of various aspects of the invention, including aspects set forth in the claims.

What is claimed is:

1. An apparatus comprising:
    an input port connected to a source of data signals;
    an output port connected to a receiver for the data signals;
    a transistor having a source and drain connected in series between the input port and the output port, and a gate configured and arranged to switch the transistor between an on state in which the transistor is configured to transfer data signals received on the input port to the output port by connecting the input port to the output port, and an off state in which the transistor disconnects the input port from the output port;
    a charge storage circuit configured and arranged to store a charge; and
    a switching circuit configured and arranged to switch the transistor between the on state and the off state by
        in a first mode, coupling a voltage across the charge storage circuit and storing a charge in the charge storage circuit while decoupling the transistor from the charge storage circuit, and
        in a second mode, switching the transistor from the off state to the on state by coupling the stored charge across the gate and one of the source and drain of the transistor.

2. The apparatus of claim 1, wherein the switching circuit is configured and arranged to:
    operate in the first mode by disconnecting the transistor from the charge storage circuit and thereafter connecting the charge storage circuit between a voltage supply port and a ground-level port; and
    operate in the second mode by disconnecting the charge storage circuit from the voltage supply port and the ground-level port and thereafter connecting the charge storage circuit across the gate and source or drain.

3. The apparatus of claim 1, wherein decoupling the transistor from the charge storage circuit includes maintaining switches between the charge storage circuit and the transistor in an open state.

4. The apparatus of claim 1, wherein the charge storage circuit is configured and arranged with the transistor to, in the second mode, apply a gate-source or gate-drain voltage of the transistor that is about constant, upon coupling of the stored charge across the gate and source or drain, therein mitigating delays in a start of data flow through the source and drain of the transistor upon switching of the transistor from the off state to the on state.

5. The apparatus of claim 1, wherein
the switching circuit is configured and arranged to, in the first mode, couple the voltage across the charge storage circuit by coupling the charge storage circuit to a power supply having a power supply voltage, and
the charge storage circuit is configured and arranged with the transistor to, in the second mode, set the gate-source or gate-drain voltage of the transistor to the power supply voltage, therein mitigating delays in a start of data flow through the source and drain of the transistor upon switching of the transistor from the off state to the on state.

6. The apparatus of claim 1, wherein the switching circuit is configured and arranged with the transistor to, in the second mode, use the stored charge to bias the gate to the stored charge level while coupling a bias voltage supply node to the gate, by biasing the gate with the stored charge while the bias voltage applied to the gate ramps from a low voltage level to the bias voltage level, wherein a time delay in ramping up the bias voltage at the gate to the bias voltage level is mitigated via the stored charge.

7. The apparatus of claim 1, wherein the switching circuit is configured and arranged to switch between the first mode and the second mode by
decoupling the transistor from a supply voltage that is used to couple the voltage across the charge storage circuit,
operating in a delay mode for a delay time period during which the charge storage circuit is decoupled from both the supply voltage and the transistor, and
after the delay mode operate in the second mode by coupling the charge storage circuit across the gate and the one of the source and drain of the transistor while maintaining the decoupling of the transistor from the supply voltage.

8. An apparatus comprising:
a transistor having a source and drain connected in series between an input port and an output port, and a gate configured and arranged to switch the transistor between an on state in which the transistor connects the input port to the output port, and an off state in which the transistor disconnects the input port from the output port;
a charge storage circuit configured and arranged to store a charge; and
a switching circuit configured and arranged to switch the transistor between the on state and the off state by
in a first mode, coupling a voltage across the charge storage circuit and storing a charge in the charge storage circuit while decoupling the transistor from the charge storage circuit, and
in a second mode, switching the transistor from the off state to the on state by coupling the stored charge across the gate and one of the source and drain of the transistor;

wherein the charge storage circuit includes a capacitor having first and second capacitor plates, and wherein the switching circuit includes:
a first set of switches configured and arranged to connect the first capacitor plate to an input voltage supply port and to connect the second capacitor plate to a ground-level port,
a second set of switches configured and arranged to connect the first capacitor plate to the gate and to connect the second capacitor plate to the one of the source and the drain of the transistor across which the stored charged is coupled, and
a control circuit configured and arranged to:
in the first mode, couple the first capacitor plate to the input voltage supply port and couple the second capacitor plate to the ground-level port by operating the first set of switches in a closed state and operating the second set of switches in an open state, and
in the second mode, couple the first capacitor plate to the gate and couple the second capacitor plate to the source or drain by operating the first set of switches in an open state and operating the second set of switches in a closed state, therein mitigating delays in a start of data flow through the source and drain of the transistor upon switching the transistor from the off state to the on state.

9. The apparatus of claim 8, wherein the control circuit is configured and arranged with the first and second set of switches to ensure non-overlapping operation of the first and second sets of switches in which the first set of switches is opened before the second set of switches is closed.

10. The apparatus of claim 8, wherein the switches include a cross-coupled NAND gate and inverters configured and arranged to be triggered by a one-shot signal that initiates operation of the respective first and second modes.

11. An apparatus comprising:
a first circuit configured and arranged to store a charge;
a transistor having a source, drain and gate, the transistor being configured and arranged to operate in an on state in which data received on an input port is passed between the input port and an output port via the source and drain, and in an off state in which data received on the input port is not passed between the input port and the output port; and
a second circuit configured and arranged to
operate in a first mode by coupling a supply voltage to the first circuit and storing the charge in the first circuit, and
operate in a second mode by decoupling the supply voltage from the first circuit and, after decoupling the supply voltage from the first circuit, coupling the stored charge across the gate and one of the source and drain of the transistor.

12. The apparatus of claim 11, wherein the second circuit is configured and arranged to use the stored charge to raise the gate-source or the gate-drain voltage of the transistor toward the level of the stored charge while the supply voltage applied to the gate ramps up, therein mitigating delays in achieving a gate-source or gate-drain voltage equilibrium using application of the supply voltage directly to the gate.

13. The apparatus of claim 11, wherein the first circuit includes a capacitor having first and second capacitor plates, and wherein the second circuit includes:

a first set of switches configured and arranged to connect the first capacitor plate to the supply voltage and to connect the second capacitor plate to a ground-level port, a second set of switches configured and arranged to connect the first capacitor plate to the gate and to connect the second capacitor plate to the one of the source and the drain of the transistor across which the stored charged is coupled, and a control circuit configured and arranged to:
  in the first mode, couple the first capacitor plate to the supply voltage and couple the second capacitor plate to a ground-level port by operating the first set of switches in a closed state and operating the second set of switches in an open state, and
  in the second mode, couple the first capacitor plate to the gate and couple the second capacitor plate to the source or drain by operating the first set of switches in an open state and operating the second set of switches in a closed state, therein mitigating delays in a start of data flow through the source and drain of the transistor upon switching of the transistor from the off state to the on state.

14. The apparatus of claim 13, further including a delay circuit configured and arranged to delay closing of the second set of switches, upon transition from the first mode to the second mode, and to ensure that the first set of switches are switched to the open state before the second set of switches are switched to the closed state.

15. A method comprising:
  using a switching circuit, operating a transistor having a source and drain connected in series between an input port and an output port, and a gate that switches the transistor between an on state, in which the transistor transfers data signals received on the input port to the output port by connecting the input port to the output port, and an off state, in which the transistor disconnects the input port from the output port, by
    in a first mode, coupling a voltage across a charge storage circuit and storing a charge in the charge storage circuit while decoupling the transistor from the charge storage circuit, and
    in a second mode, switching the transistor from the off state to the on state by coupling the stored charge across the gate and one of the source and drain of the transistor.

16. The method of claim 15, wherein storing a charge in the charge storage circuit includes storing the charge in a capacitor having first and second capacitor plates, and wherein operating the transistor includes:
  in the first mode, coupling the first capacitor plate to an input voltage supply port and coupling the second capacitor plate to a ground-level port by operating a first set of switches in a closed state and operating a second set of switches in an open state, and
  in the second mode, coupling the first capacitor plate to the gate and coupling the second capacitor plate to the source or drain by operating the first set of switches in an open state and operating the second set of switches in a closed state, therein mitigating delays in a start of data flow through the source and drain of the transistor upon switching of the transistor from the off state to the on state.

17. The method of claim 15, further including ensuring non-overlapping operation of the first mode and the second mode by decoupling the voltage from the charge storage circuit, prior to coupling the stored charge across the gate and one of the source and drain of the transistor.

18. The method of claim 15, wherein:
  operating in the first mode includes disconnecting the transistor from the charge storage circuit and thereafter connecting the charge storage circuit between a voltage supply port and a ground-level port; and
  operating in the second mode includes disconnecting the charge storage circuit from the voltage supply port and the ground-level port and thereafter connecting the charge storage circuit across the gate and source or drain.

19. The method of claim 15, wherein operating the transistor includes using the stored charge to mitigate delay in equilibrating the gate-source voltage or the gate-drain voltage of the transistor, as would occur upon coupling of the gate to the supply voltage without coupling the stored charge across the gate and the one of the source and drain of the transistor.

20. The method of claim 15, wherein coupling the stored charge across the gate and the one of the source and drain of the transistor includes mitigating delay in a start of data flow through the source and drain of the transistor upon switching of the transistor from the off state to the on state, by using the stored charge to set the gate-source or gate-drain voltage while coupling a bias voltage supply node to the gate that operates to ramps from a low voltage level to the bias voltage level with a time delay.

* * * * *